United States Patent
Yoko

(10) Patent No.: US 8,198,915 B2
(45) Date of Patent: Jun. 12, 2012

(54) SEMICONDUCTOR DEVICE USING NORMAL AND AUXILIARY THROUGH SILICON VIAS

(75) Inventor: Hideyuki Yoko, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 12/923,752

(22) Filed: Oct. 6, 2010

(65) Prior Publication Data

US 2011/0084729 A1 Apr. 14, 2011

(30) Foreign Application Priority Data

Oct. 9, 2009 (JP) .................................. 2009-235487

(51) Int. Cl.
*H01L 25/00* (2006.01)
*H03K 19/00* (2006.01)

(52) U.S. Cl. ............... 326/56; 326/41; 326/47; 326/101

(58) Field of Classification Search .............. 326/37–41, 326/47, 101, 82–87, 56–57
See application file for complete search history.

(56) References Cited

U.S. PATENT DOCUMENTS

| | | | |
|---|---|---|---|
| 6,801,969 B2 * | 10/2004 | Crafts et al. ................... | 710/100 |
| 7,046,056 B2 * | 5/2006 | Kizer et al. .................... | 327/147 |
| 7,489,030 B2 | 2/2009 | Shibata et al. | |
| 2005/0206419 A1 * | 9/2005 | Kizer et al. .................... | 327/158 |
| 2007/0240094 A1 * | 10/2007 | Anshumali et al. ............. | 716/18 |
| 2009/0039915 A1 * | 2/2009 | Ruckerbauer et al. .......... | 326/38 |
| 2010/0060310 A1 * | 3/2010 | Laisne et al. .................... | 326/10 |
| 2010/0245647 A1 * | 9/2010 | Honda et al. ................... | 348/308 |
| 2011/0084729 A1 * | 4/2011 | Yoko .............................. | 326/56 |

FOREIGN PATENT DOCUMENTS

JP 2007-158237 6/2007

* cited by examiner

*Primary Examiner* — Shawki Ismail
*Assistant Examiner* — Thienvu Tran
(74) *Attorney, Agent, or Firm* — MacGinn IP Law Group, PLLC

(57) ABSTRACT

One interface chip and a plurality of core chips are electrically connected via a plurality of through silicon vias. A data signal of a driver circuit is input into the core chip via any one of the through silicon vias. An output switching circuit activates any one of tri-state inverters and selects one of the through silicon vias. The tri-state inverters amplify the data signal and transmit it to the through silicon via. Similarly, an input switching circuit activates any one of tri-state inverters. These tri-state inverters also amplify the data signal transmitted from the through silicon via and supply it to the receiver circuit.

15 Claims, 11 Drawing Sheets

SEMICONDUCTOR DEVICE USING NORMAL AND AUXILIARY THROUGH SILICON VIAS

BACKGROUND OF THE INVENTION

1. Field of the Invention

The present invention relates to a semiconductor device, and more particularly relates to a semiconductor device including a plurality of semiconductor chips electrically connected by through silicon vias.

2. Description of Related Art

A memory capacity required in semiconductor memory devices such as DRAM (Dynamic Random Access Memory) is increasing every year. In recent years, there has been proposed a method to meet this requirement. In this method, a plurality of memory chips are stacked and electrically connected via through silicon vias arranged on a silicon substrate (see Japanese Patent Application Laid-open No. 2007-158237).

Specifically, in a semiconductor memory device in which an interface chip having front end units such as interface circuits incorporated thereon and a core chip having back end units such as memory cores incorporated thereon are stacked, because read data that is read in parallel from the memory cores is supplied as it is to the interface chip without performing serial conversion, a large number of through silicon vias (approximately 4000 units in some cases) are required. However, the entire chip becomes defective when even one of the through silicon vias becomes defective, and if a plurality of the chips are stacked, all the chips become defective. Thus, to prevent the entire chip from becoming defective due to a defective through silicon via, auxiliary through silicon vias are sometimes provided in such semiconductor memory devices.

In the semiconductor device disclosed in Japanese Patent Application Laid-open No. 2007-158237, one auxiliary through silicon via is allocated to a group of through silicon vias constituted by a plurality of through silicon vias (for example, eight through silicon vias).

If a defect occurs in one of the through silicon vias belonging to the group, the defective through silicon via is relieved by the auxiliary through silicon via allocated to the group.

As the number of stacked semiconductor chips increases, load on the through silicon vias also increases, and this may cause degradation in signal quality. Examinations performed by the inventor to find out a solution to this issue have proved that driver circuits (buffers) need to be provided to amplify signals, respectively, on an inlet and an outlet of the through silicon via. For example, there is assumed a state where signals are transmitted from an interface chip to a core chip via a through silicon via. If the signals are amplified by the driver circuit, provided on the interface chip side, immediately before the signals enter into the through silicon via, and the signals are re-amplified by the driver circuit, provided on the core chip side, immediately after the signals come out from the through silicon via, it becomes easy to maintain a good signal quality.

As described above, due to auxiliary through silicon vias, the interface chip can selectively use one through silicon via among the multiple through silicon vias. Therefore, a switch is necessary to select one path among a plurality of paths that connect a signal transmitting unit to each of the through silicon vias. Similarly, on the core chip side, a switch is necessary to select one path among a plurality of paths that connect each of the through silicon vias to a signal receiving unit. Normally, these switches are formed by transistors and they cause signal transmission delay. Because it is necessary to provide two switches in a path connecting the transmitting unit to the receiving unit via the through silicon via, signal delay tends to increase.

This problem is not limited to semiconductor memory devices such as DRAMs, but can occur to all semiconductor devices including semiconductor chips that are electrically connected to each other via through silicon vias.

SUMMARY

In one embodiment, there is provided a semiconductor device that includes a first semiconductor chip that includes a driver circuit, a second semiconductor chip that includes a receiver circuit in which signals are input from the driver circuit, and a plurality of through silicon vias that connect the first semiconductor chip to the second semiconductor chip. The first semiconductor chip includes, a plurality of first tri-state inverters respectively inserted on paths that connect the driver circuit to each of the through silicon vias, and an output switching circuit that exclusively connects an output terminal of the driver circuit to any one of the through silicon vias by exclusively activating any one of the first tri-state inverters. The second semiconductor chip includes a plurality of second tri-state inverters that are respectively inserted on paths that connect each of the through silicon vias to the receiver circuit, and an input switching circuit that exclusively connects an input terminal of the receiver circuit to any one of the through silicon vias by exclusively activating any one of the second tri-state inverter.

According to the present invention, in a stacked semiconductor device that can selectively use one through silicon via among a plurality of through silicon vias, transmission delay of signals passing through the through silicon via can be easily suppressed.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
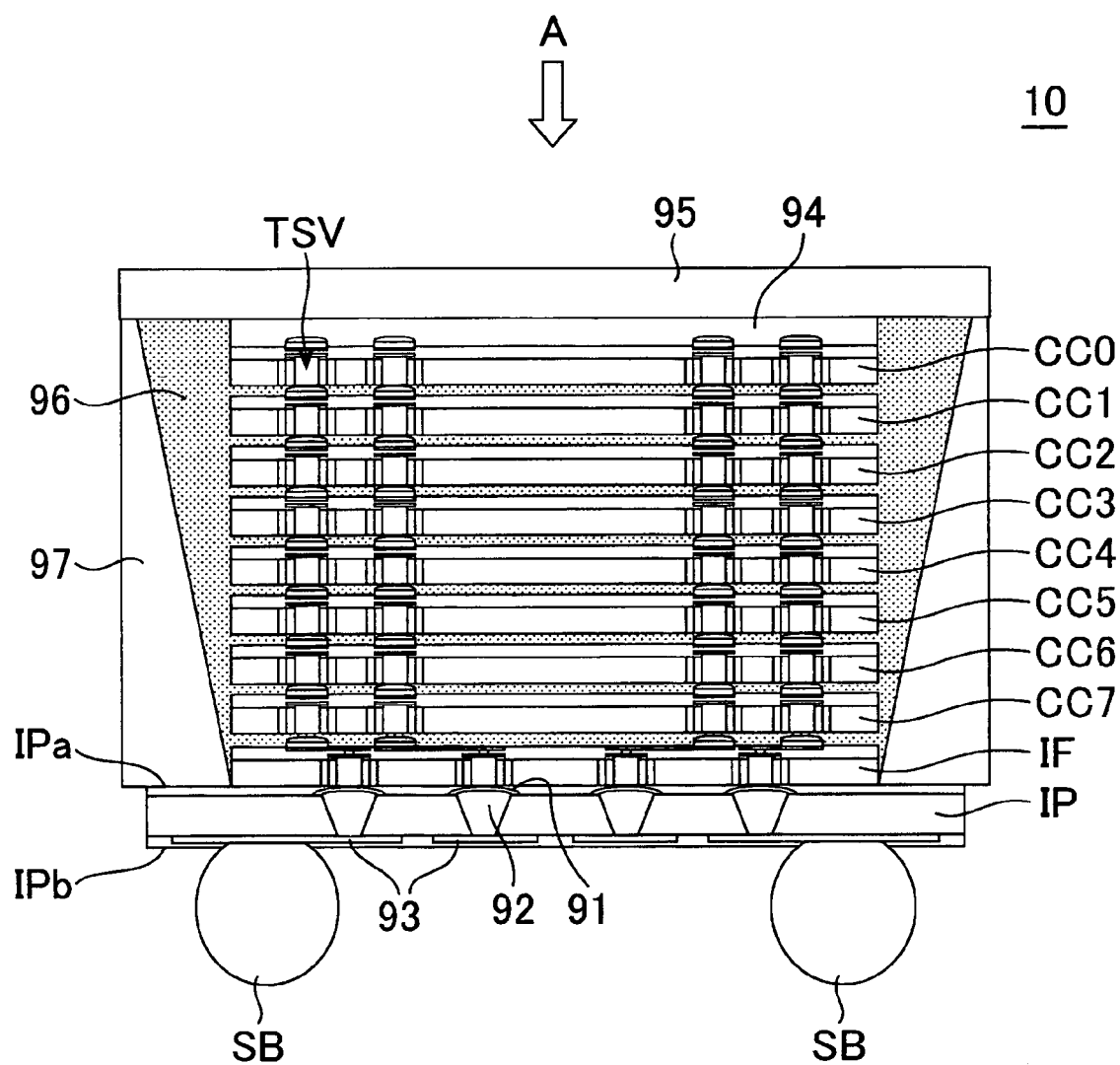
FIG. 1 is a schematic cross-sectional view provided to explain the structure of a semiconductor memory device according to the preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural Through Silicon Vias (TSV) penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor memory device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the TSV does not need to be provided in the interface chip IF. The interface chip IF may be disposed to be interposed between the two interposers IP.

The interposer IP functions as a rewiring substrate to increase an electrode pitch and secures mechanical strength of the semiconductor memory device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a read frame 95. Gaps between the core chips CC0 to CC7 and the interface chip IF are filled with an underfill 96 and surrounding portions of the gaps are covered by a sealing resin 97. Thereby, the individual chips are physically protected.

Figure 2A:
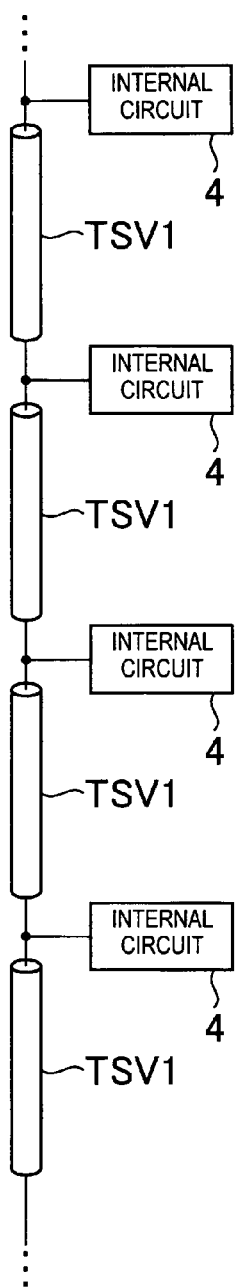
FIGS. 2A to 2C are diagram showing the various types of TSV provided in a core chip.

When most of the TSVs provided in the core chips CC0 to CC7 are two-dimensionally viewed from a lamination direction, that is, viewed from an arrow A shown in FIG. 1, the TSVs are short-circuited from the TSVs of other layers provided at the same position. That is, as shown in FIG. 2A, the vertically disposed TSV1s that are provided at the same position in plain view are short-circuited, and one wiring line is configured by the TSV1. The TSV1 that are provided in the core chips CC0 to CC7 are connected to internal circuits in the core chips, respectively. Accordingly, input signals (command signal, address signal, etc.) that are supplied from the interface chip IF to the TSV1s shown in FIG. 2A are commonly input to the internal circuits 4 of the core chips CC0 to CC7. Output signals (data etc.) that are supplied from the core chips CC0 to CC7 to the TSV1 are wired-ORed and input to the interface chip IF.

Figure 2B:
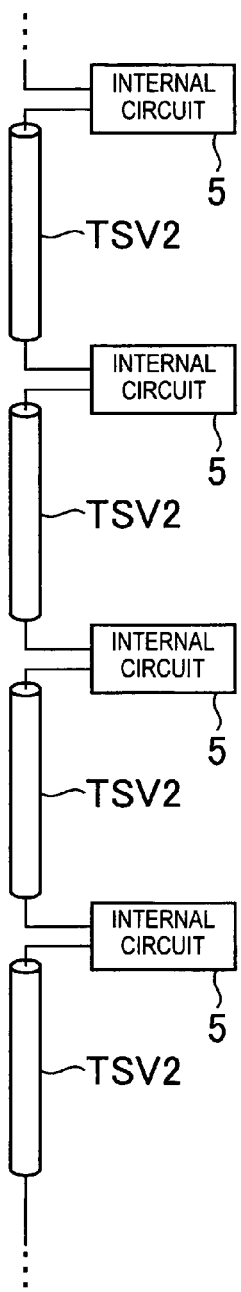

Meanwhile, as shown in FIG. 2B, the a part of TSVs are not directly connected to the TSV2 of other layers provided at the same position in plain view but are connected to the TSV2 of other layers through the internal circuits 5 provided in the core chips CC0 to CC7. That is, the internal circuits 5 that are provided in the core chips CC0 to CC7 are cascade-connected through the TSV2. This kind of TSV2 is used to sequentially transmit predetermined information to the internal circuits 5 provided in the core chips CC0 to CC7. As this information, layer address information to be described below is exemplified.

Figure 2C:
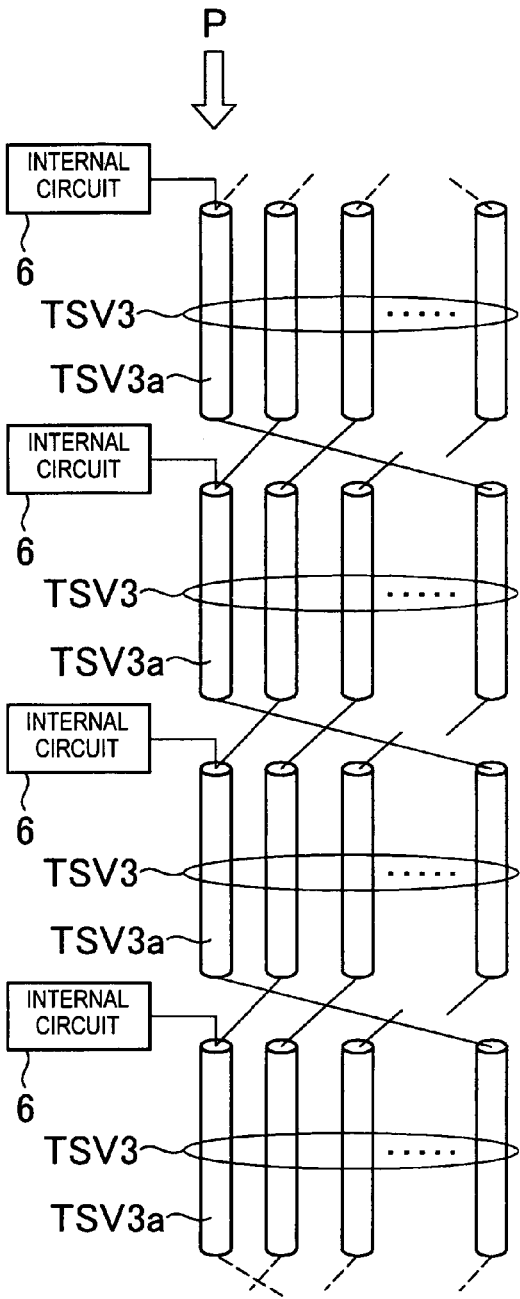

Another TSV group is short-circuited from the TSVs of other layer provided at the different position in plain view, as shown in FIG. 2C. With respect to this kind of TSV group 3, internal circuits 6 of the core chips CC0 to CC7 are connected to the TSV3a provided at the predetermined position P in plain view. Thereby, information can be selectively input to the internal circuits 6 provided in the core chips. As this information, defective chip information to be described below is exemplified.

As such, as types of the TSVs provided in the core chips CC0 to CC7, three types (TSV1 to TSV3) shown in FIGS. 2A to 2C exist. As described above; most of the TSVs are of a type shown in FIG. 2A, and an address signal, a command signal, and a clock signal are supplied from the interface chip IF to the core chips CC0 to CC7, through the TSV1 of the type shown in FIG. 2A. Read data and write data are input to and output from the interface chip IF through the TSV1 of the type shown in FIG. 2A. Meanwhile, the TSV2 and TSV3 of the types shown in FIGS. 2B and 2C are used to provide individual information to the core chips CC0 to CC7 having the same structure.

Figure 3:
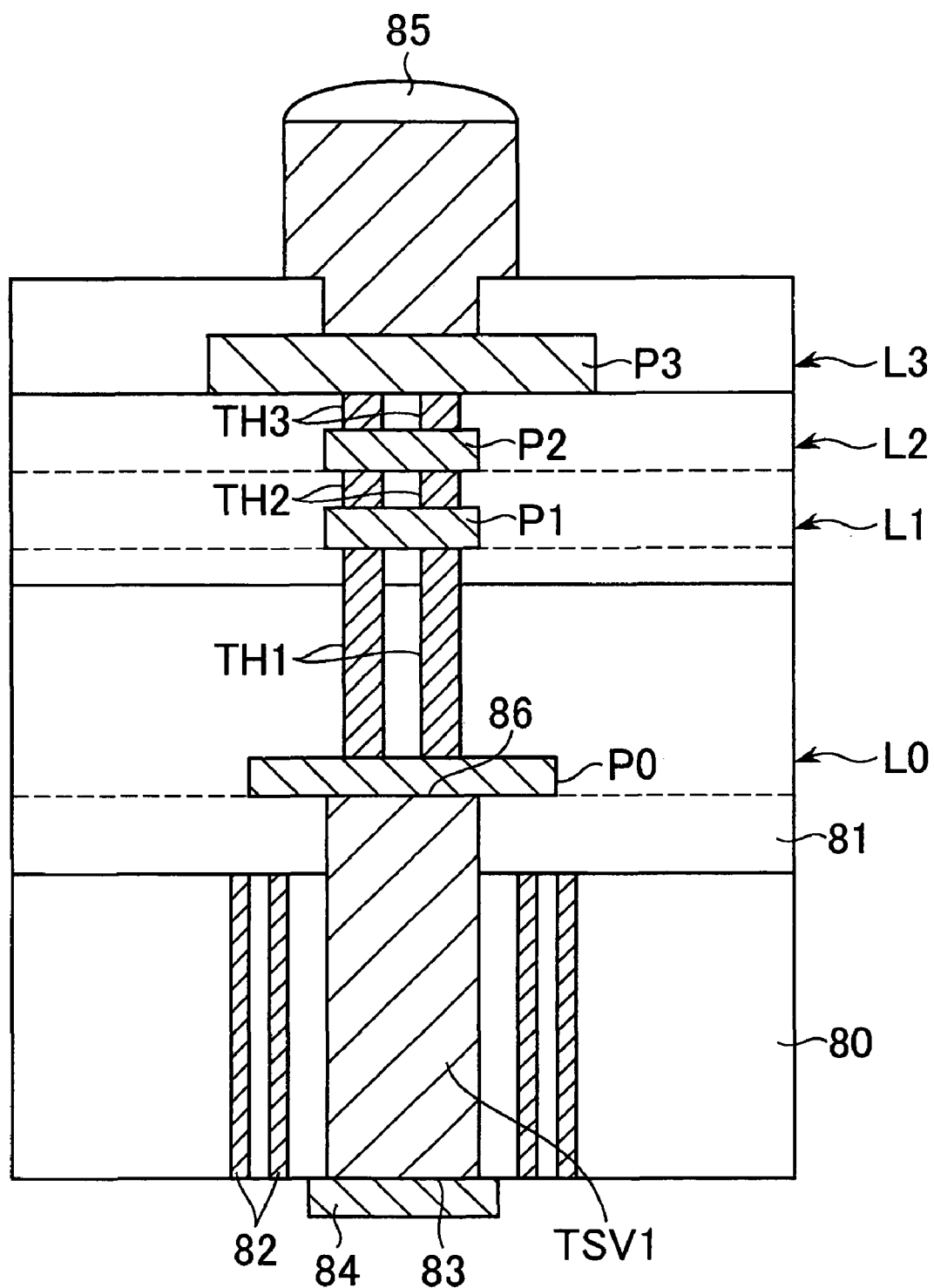
FIG. 3 is a cross-sectional view illustrating the structure of the TSV1 of the type shown in FIG. 2A.

FIG. 3 is a cross-sectional view illustrating the structure of the TSV1 of the type shown in FIG. 2A.

As shown in FIG. 3, the TSV1 is provided to penetrate a silicon substrate 80 and an interlayer insulating film 81 provided on a surface of the silicon substrate 80. Around the TSV1, an insulating ring 82 is provided. Thereby, the TSV1 and a transistor region are insulated from each other. In an example shown in FIG. 3, the insulating ring 82 is provided double. Thereby, capacitance between the TSV1 and the silicon substrate 80 is reduced.

An end 83 of the TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
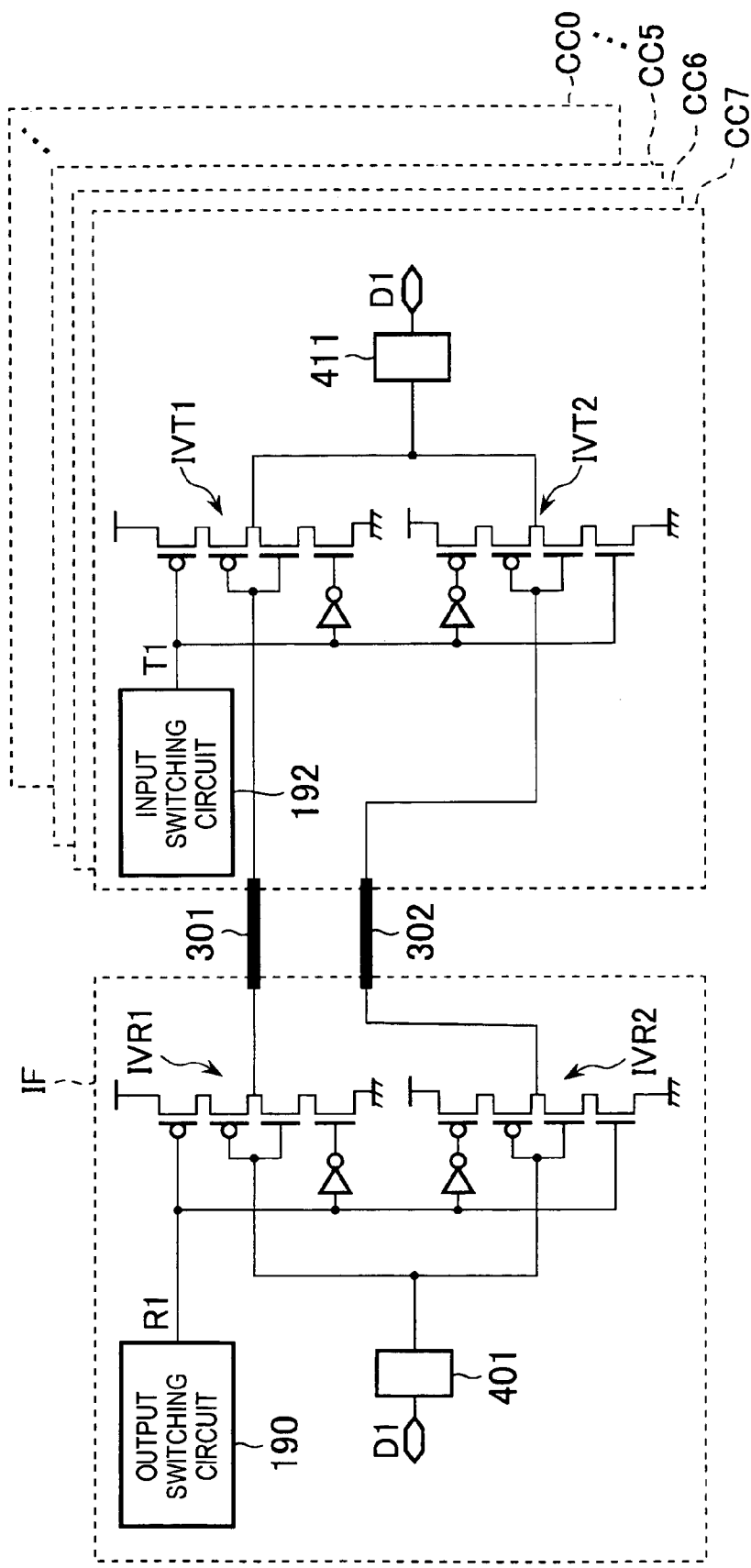
FIG. 4 is a schematic diagram partially showing a connection between the interface chip IF and the core chips.

FIG. 4 is a schematic diagram partially showing a connection between the interface chip IF and the core chips CC0 to CC7. As a representative example, FIG. 4 shows the connection between the interface chip IF and the core chip CC7. However, the same connection relation holds true on other core chips CC0 to CC6. The same holds true on other drawings.

The interface chip IF includes a driver circuit 401, an output switching circuit 190, and two tri-state inverters IVR1 and IVR2. The core chip CC7 includes an input switching circuit 192, a receiver circuit 411, and two tri-state inverters IVT1 and IVT2. The driver circuit 401 on the interface chip IF and the receiver circuit 411 on the core chip CC7 are electrically connected via two through silicon vias 301 and 302. A data signal D1 transmitted from the driver circuit 401 reaches the receiver circuit 411 via any one of the through silicon vias 301 and 302.

The output switching circuit 190 on the interface chip IF selects any one of the through silicon vias 301 and 302 as a transmission path for the data signal D1. On the other hand, the input switching circuit 192 on the core chip CC7 selects any one of the through silicon vias 301 and 302 as a reception path of the data signal D1. When the output switching circuit 190 selects the through silicon via 301, the input switching circuit 192 also selects the through silicon via 301. When the output switching circuit 190 selects the through silicon via 302, the input switching circuit 192 also selects the through silicon via 302.

The tri-state inverter IVR1 is inserted on a path that connects the driver circuit 401 to the through silicon via 301 and the tri-state inverter IVR2 is inserted on a path that connects the driver circuit 401 to the through silicon via 302. The tri-state inverter IVR1 includes two selecting transistors connected between a power source and a ground. Each of the selecting transistors includes a PMOS (Positive channel Metal Oxide Semiconductor) FET (Field effect transistor) and an NMOS (Negative channel Metal Oxide Semiconductor) FET. Unless both the selecting transistors are activated, the tri-state inverter IVR1 does not function as an inverter and its output is maintained at a high impedance state. The same holds true on the tri-state inverter IVR2.

When the respective selecting transistors of the tri-state inverters IVR1 and IVR2 are activated, a connection is established between the power source and the ground, and an operation potential is supplied to the tri-state inverters IVR1 and IVR2. Thus, the data signal D1 transmitted from the driver circuit 401 can be amplified and transmitted to the through silicon vias 301 and 302. That is, the tri-state inverters IVR1 and IVR2 function as driver circuits on a transmission side. Even when a through silicon via is long and the load on the through silicon via is more, by arranging such a tri-state inverter at the inlet of the through silicon via, intensity of the data signal D1 can be adequately enhanced before transmitting the data signal D1 to the through silicon via.

A binary (H, L) output selection signal R1 is supplied to the selecting transistors of the tri-state inverters IVR1 and IVR2 from the output switching circuit 190. When the input selection signal R1 is H (high logical level), the tri-state inverter IVR1 is inactivated and the tri-state inverter IVR2 is activated. On the other hand, when the input selection signal R1 is L (low logical level), the tri-state inverter IVR1 is activated and the tri-state inverter IVR2 is inactivated. That is, the through silicon via 302 is selected when the input selection signal R1 is H, and the through silicon via 301 is selected when the input selection signal R1 is L. In this manner, the data signal D1 output from the driver circuit 401 is amplified by any one of the tri-state inverters IVR1 and IVR2, and it is input into the core chip CC7 via one of the through silicon vias 301 and 302 depending on a logical level of the output selection signal R1.

The tri-state inverter IVT1 is inserted on a path that connects the through silicon via 301 to the receiver circuit 411, and the tri-state inverter IVT2 is inserted on a path that connects the through silicon via 302 to the receiver circuit 411.

When the respective selecting transistors of the tri-state inverters IVT1 and IVT2 are activated, a connection is established between the power source and the ground, and an operation potential is supplied to the tri-state inverters IVT1 and IVT2. Thus, the data signal D1 transmitted from the through silicon vias 301 and 302 can be amplified and transmitted to the receiver circuit 411. That is, the tri-state inverters IVT1 and IVT2 function as a driver circuit on a reception side. Thus, by arranging such tri-state inverters IVT1 and IVT2 on an outlet of the through silicon vias 301 and 302, intensity of the data signal D1 can be adequately enhanced after the data signal D1 is transmitted from the through silicon vias 301 and 302.

The tri-state inverters respectively arranged on the inlet and outlet of the through silicon vias compensate attenuation of the data signal D1 when the data signal D1 passes through the through silicon vias.

A binary (H, L) input selection signal T1 is supplied to the selecting transistors of the tri-state inverters IVT1 and IVT2 from the input switching circuit 192. When the input selection signal T1 is H (high logical level), the tri-state inverter IVT1 is inactivated and the tri-state inverter IVT2 is activated. On the other hand, when the output selection signal T1 is L (low logical level), the tri-state inverter IVT1 is activated and the tri-state inverter IVT2 is inactivated. That is, the through silicon via 302 is selected when the input selection signal T1 is H, and the through silicon via 301 is selected when the input selection signal T1 is L. In this manner, the data signal D1 is amplified by any one of the tri-state inverters IVT1 and IVT2, after passing through any one of the through silicon vias 301 and 302 and the data signal D1 is input into the receiver circuit 411.

The output selection signal R1 and the input selection signal T1 are mutually interlocked. When R1=T1=L, the driver circuit 401, the tri-state inverter IVR1, the through silicon via 301, the tri-state inverter IVT1, and the receiver circuit 411 are connected. In this case, both the tri-state inverters IVR2 and IVT2 are maintained at a high impedance state, and the through silicon via 302 becomes unusable. When R1=T1=H, the driver circuit 401, the tri-state inverter IVR2, the through silicon via 302, the tri-state inverter IVT2, and the receiver circuit 411 are connected, and the through silicon via 301 becomes unusable. That is, the through silicon vias 301 and 302 are exclusively selected.

The key point here is that, the transmission path is selected by activating or inactivating the tri-state inverters IVR1 and IVR2 instead of connecting or disconnecting the path itself that connects the driver circuit 401 to the tri-state inverters IVR1 and IVR2. Inserting a switch in the path to control connection or disconnection of the path leads to a transmission delay. However, when activation or inactivation of the tri-state inverters IVR1 and IVR2 is to be controlled according to the present embodiment, it is not necessary to insert a particular delay element in the path that connects the driver circuit 401 to the tri-state inverters IVR1 and IVR2. This is because the tri-state inverters function as a driver circuit (a buffer for signal amplification) and they also function as a switch that controls connection or disconnection of the path.

The same holds true on the core chip CC7 side. By controlling activation or inactivation of the tri-state inverters IVT1 and IVT2, signal delay in the path that connects the through silicon vias 301 and 302 to the receiver circuit 411 is significantly reduced.

Figure 5:
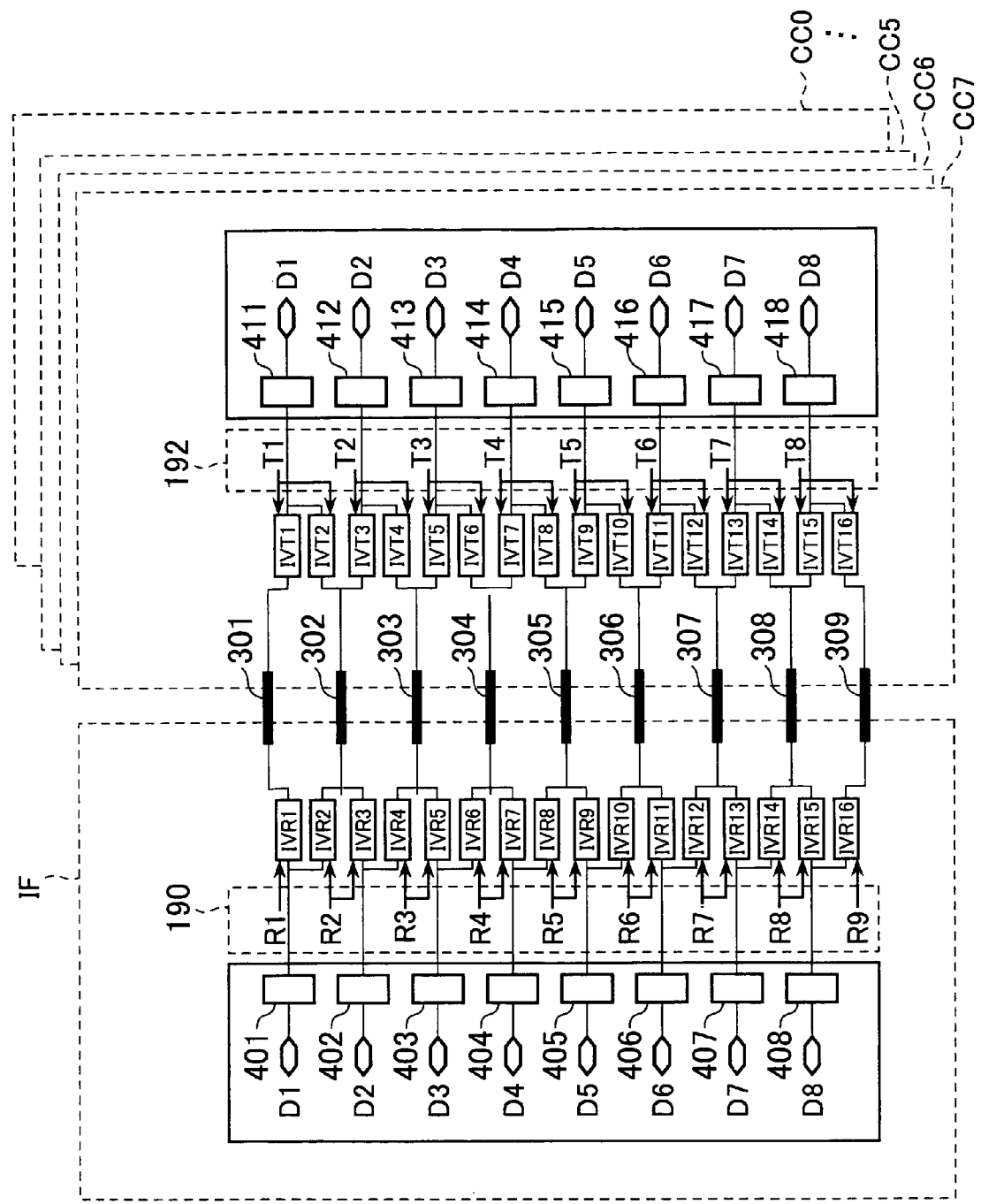
FIG. 5 is a schematic diagram showing an overall connection between the interface chip IF and the core chips.

FIG. 5 is a schematic diagram showing an overall connection between the interface chip IF and the core chips CC0 to CC7. FIG. 5 shows 8-bit data D1 to D8 are supplied from the interface chip IF to each of the core chips CC0 to CC7. The data D1 to D8 are signals that need to be simultaneously output from the interface chip IF and simultaneously input into each of the core chips CC0 to CC7. Address signals and write data are examples of such data. In FIG. 5, an example of the core chip CC7 is explained.

As shown in FIG. 5, the interface chip IF includes eight driver circuits 401 to 408 corresponding to the data D1 to D8, and the core chips. CC0 to CC7 include eight receiver circuits 411 to 418, respectively, corresponding to the data D1 to D8. Whereas in the present embodiment, nine (8+1) through silicon vias 301 to 309 are provided to connect the driver circuits 401 to 408 to the receiver circuits 411 to 418. Among the through silicon vias 301 to 309, the through silicon via 309 is an auxiliary through silicon via. The through silicon via 309 is not used unless any of the other through silicon vias 301 to 308 is defective.

The interface chip IF includes the output switching circuit 190 that connects an output terminal of each of the driver circuits 401 to 408 to one of two corresponding through silicon vias via tri-state inverters IVR1 to IVR16. The two corresponding through silicon vias here means an i-th through silicon via and an (i+1)-th through silicon via when a last digit of the reference numeral of the driver circuits 401 to 408 is taken as i (i is a value from 1 to 8). For example, a first through silicon via 301 and a second through silicon via 302 correspond to the driver circuit 401, and the second through silicon via 302 and a third through silicon via 303 correspond to the driver circuit 402. Thus, some of the through silicon vias, that is, the through silicon vias 302 to 308, correspond to two driver circuits. However, two driver circuits are never connected to the same through silicon, via. Thus, connection is made to only one through silicon via at a given time point. As for which one of the through silicon vias is to be selected, it is determined by output selection signals R1 to R9.

As shown in FIG. 5, the output selection signals R1 to R9 are respectively allocated to the through silicon vias 301 to 309. The output selection signal R1 activates the tri-state inverter IVR1 and the input selection signal T1 activates the tri-state inverter IVT1. In this case, the driver circuit 401 is connected to the receiver circuit 411 via the through silicon via 301. Similarly, among the tri-state inverters IVR1 to IVR16, and IVT1 to IVT16, the tri-state inverters (IVR1, IVR3, IVR5, . . . , IVR15, IVT1, IVT3, IVT5, . . . , IVT15) having the last digit of the reference numeral as an odd number are activated. As a result, the driver circuits 402 to 408 are connected to the receiver circuits 412 to 418 via the through silicon vias 302 to 308. The auxiliary through silicon via 309 is not used.

The same connection relation holds true on the core chips CC0 to CC6. Each of the core chips CC0 to CC7 includes the input switching circuit 192, and input terminals of the receiver circuits 411 to 418 are respectively connected to the through silicon vias 301 to 308 via the tri-state inverters IVT1 to IVT16.

The auxiliary through silicon via 309 is used when one of the through silicon vias 301 to 308 becomes defective. The defective through silicon via is not simply replaced by the auxiliary through silicon via 309; however, a connection relation between the through silicon vias 301 to 309 and the driver circuits 401 to 408, and a connection relation between the through silicon vias 301 to 309 and the receiver circuits 411 to 418 are shifted with the defective through silicon via as a boundary.

When a through silicon via 30$x$ ($x$ is a value from 1 to 8) is defective, an i-th through silicon via is selected for a driver circuit whose last digit of the reference numeral is 1 to x−1 and an (i+1)-th through silicon via is selected for a driver circuit whose last digit of the reference numeral is x to 8.

As a specific example, it is assumed that a defect has occurred in the through silicon via 306. Although the defect has occurred in the through silicon via 306, the driver circuits 401 to 405 use the through silicon vias 301 to 305 in a usual manner. That is, the tri-state inverters (IVR1, IVR3, IVR5, IVR7, IVR9, IVT1, IVT3, IVT5, and IVT9) having the last digit of the reference numeral as the odd number are activated in the same order for the driver circuits 401 to 405.

The tri-state inverters (IVR12, IVR14, IVR16, IVT12, IVT14, and IVT16) having the last digit of the reference numeral as an even number are activated for the driver circuits 406 to 408. As a result, the driver circuit 406 is connected to the receiver circuit 416 via the next through silicon via 307 instead of the through silicon via 306, and the driver circuits 407 and 408 are connected to the receiver circuits 417 and 418 via the through silicon vias 308 and 309, respectively. In this manner, the connection relation between the driver circuits 401 to 408 and the through silicon vias 301 to 309 is shifted with the defective through silicon via 306 as a boundary.

That is, when the through silicon via $30x$ is defective, a driver circuit $40i$ ($i<x$) is connected to a receiver circuit $41i$ via a through silicon via $30i$, and the driver circuit $40i$ ($i \geq x$) is connected to the receiver circuit $41i$ via a through silicon via $30$ ($i+1$).

Specifically, the defective through silicon via 306 is not simply replaced by the auxiliary through silicon via 309; however, the connection relation between the through silicon vias 301 to 309 and the driver circuits 401 to 408, and the connection relation between the through silicon vias 301 to 309 and the receiver circuits 411 to 418 are shifted with the defective through silicon via 306 as a boundary. In this manner, even after replacement of the through silicon via, an output terminal of a driver circuit having a relatively larger reference numeral is connected to a through silicon via having a relatively larger reference numeral, and an input terminal of a receiver circuit having a relatively larger reference numeral is connected to the through silicon via having the relatively larger reference numeral. Therefore, when the through silicon vias 301 to 309 are arranged in this order, as far as the i-th through silicon via and the (i+1)-th through silicon via are arranged adjacent to each other, a difference in wiring lengths almost does not occur between signal paths before and after replacement of the through silicon vias. Because almost no skew is generated due to replacement of through silicon vias, the signal quality can be enhanced.

Figure 6:
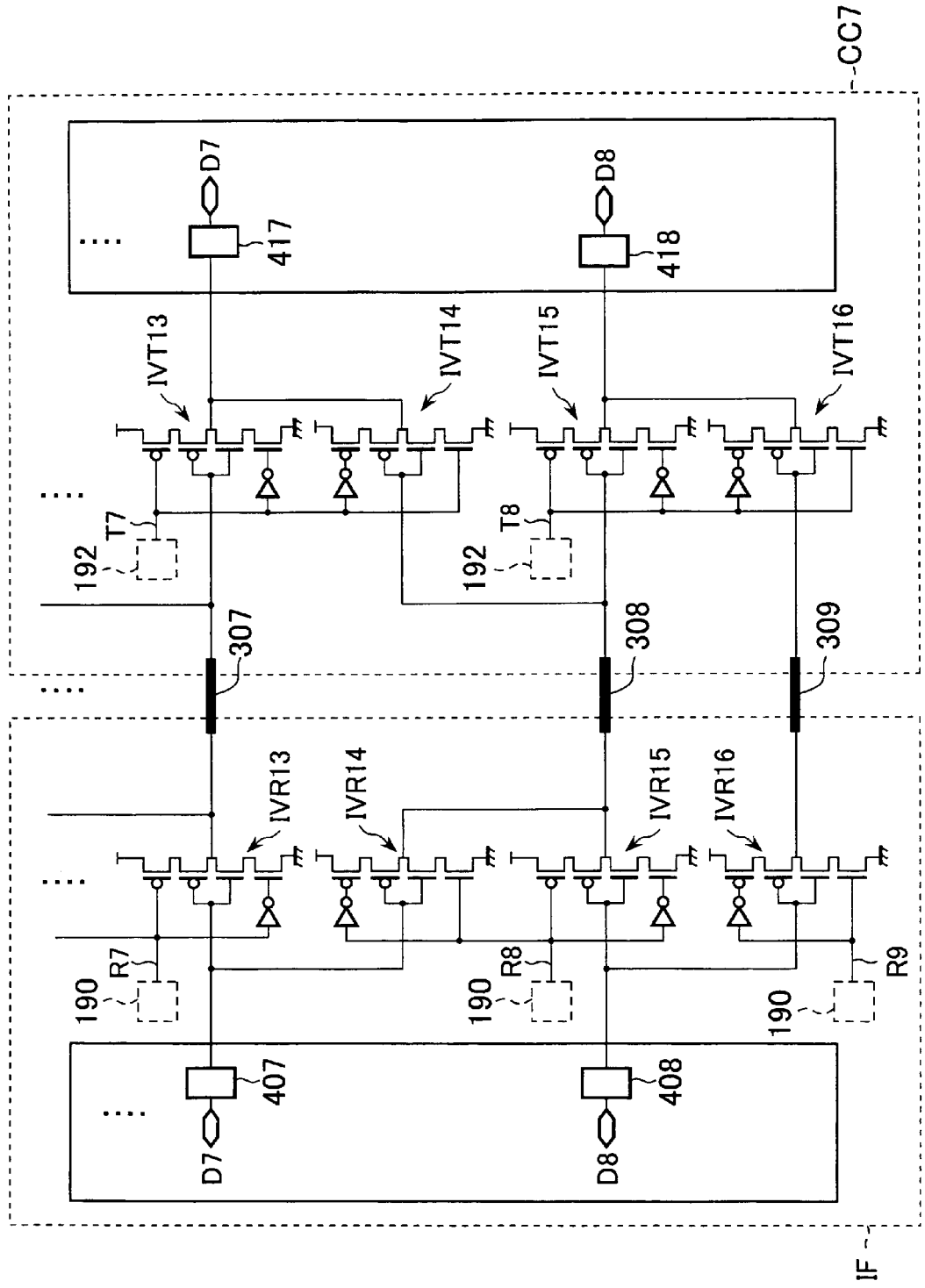
FIG. 6 is a circuit diagram showing the connection shown in FIG. 5 in more detail.

FIG. 6 is a circuit diagram showing the connection shown in FIG. 5 in more detail. When the through silicon via 306 is defective, a logical level of the output selection signal R8 becomes H and the driver circuit 407 is connected to the through silicon via 308 via the tri-state inverter IVR14. Although outputs of the tri-state inverters IVR14 and IVR15 are connected to the through silicon via 308 by wired-OR, the output of the tri-state inverter IVR15 that has become inactive is maintained at a high impedance state. Therefore, transmission of signals from the driver circuit 407 to the through silicon via 308 is not affected. The logical level of the input selection signal T7 also becomes H. Thus, the tri-state inverter IVT14 is activated and the receiver circuit 417 is connected to the through silicon via 308. Although outputs of the tri-state inverters IVT13 and IVT14 are connected to the receiver circuit 417 by wired-OR, the output of the tri-state inverter IVT13 that has become inactive is maintained at a high impedance state. Therefore, transmission of signals from the through silicon via 308 to the receiver circuit 417 is not affected. Similarly, the logical level of the output selection signal R9 becomes H and the driver circuit 408 is connected to the through silicon via 309. The logical level of the input selection signal T8 also becomes H and the through silicon via 309 is connected to the receiver circuit 418.

Figure 7:
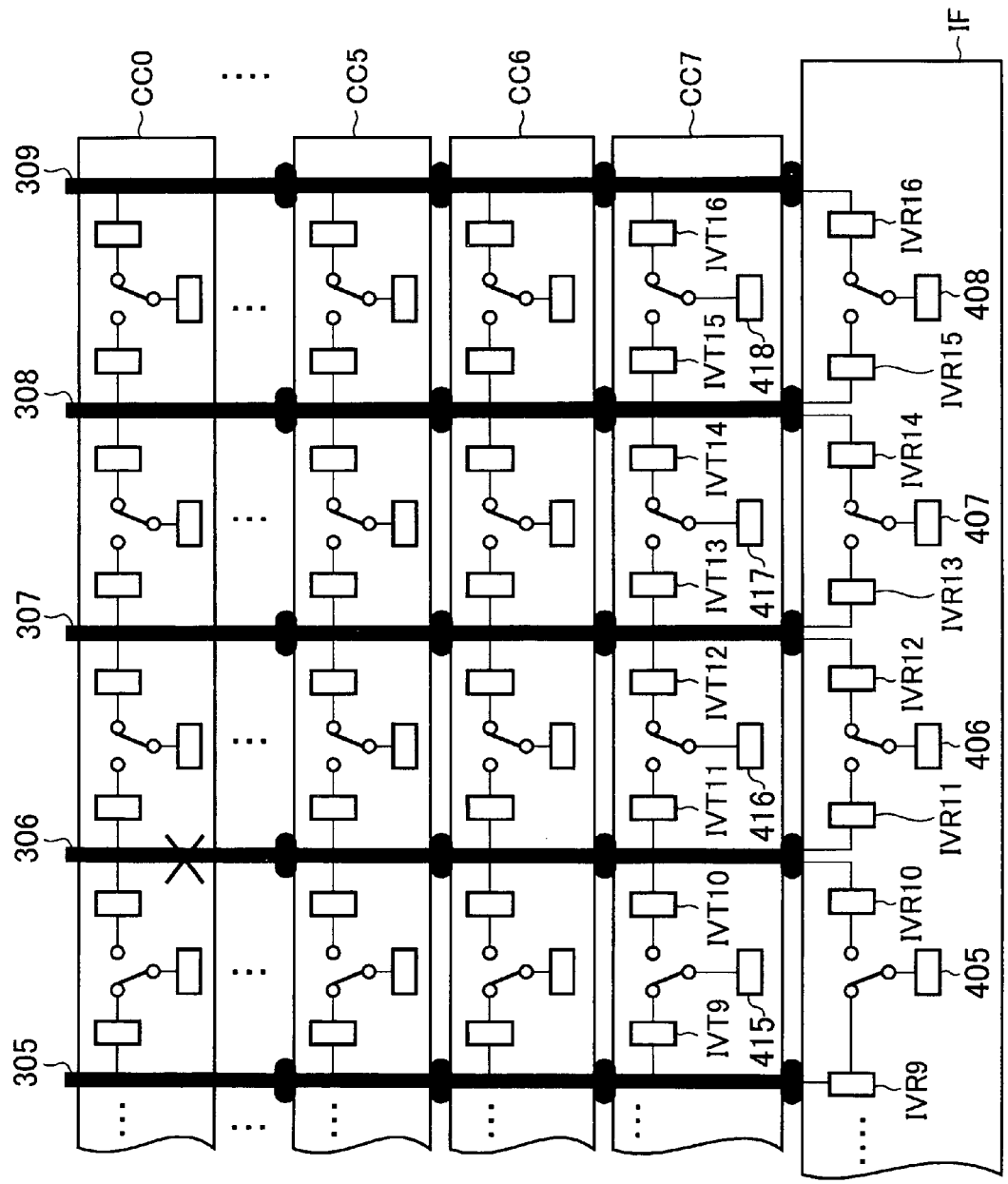
FIG. 7 is a schematic diagram for three-dimensionally showing a connection relation between the interface chip and the core chips.

FIG. 7 is a schematic diagram for three-dimensionally showing a connection relation between the interface chip IF and the core chips CC0 to CC7. FIG. 7 shows a state where the through silicon via 306 in the core chip CC0 among the core chips CC0 to CC7 is defective. When a through silicon via in one of the core chips CC0 to CC7 is defective, the corresponding through silicon vias in the other core chips are all invalidated. In the example shown in FIG. 7, because the through silicon via 306 in the core chip CC0 is defective, the through silicon vias 306 in the other core chips CC1 to CC7 are invalidated irrespective of whether they are defective. That is, the connection relation between the through silicon vias and the driver circuits and the connection relation between the through silicon vias and the receiver circuits are the same in the interface chip IF and the core chips CC0 to CC7.

Figure 8:
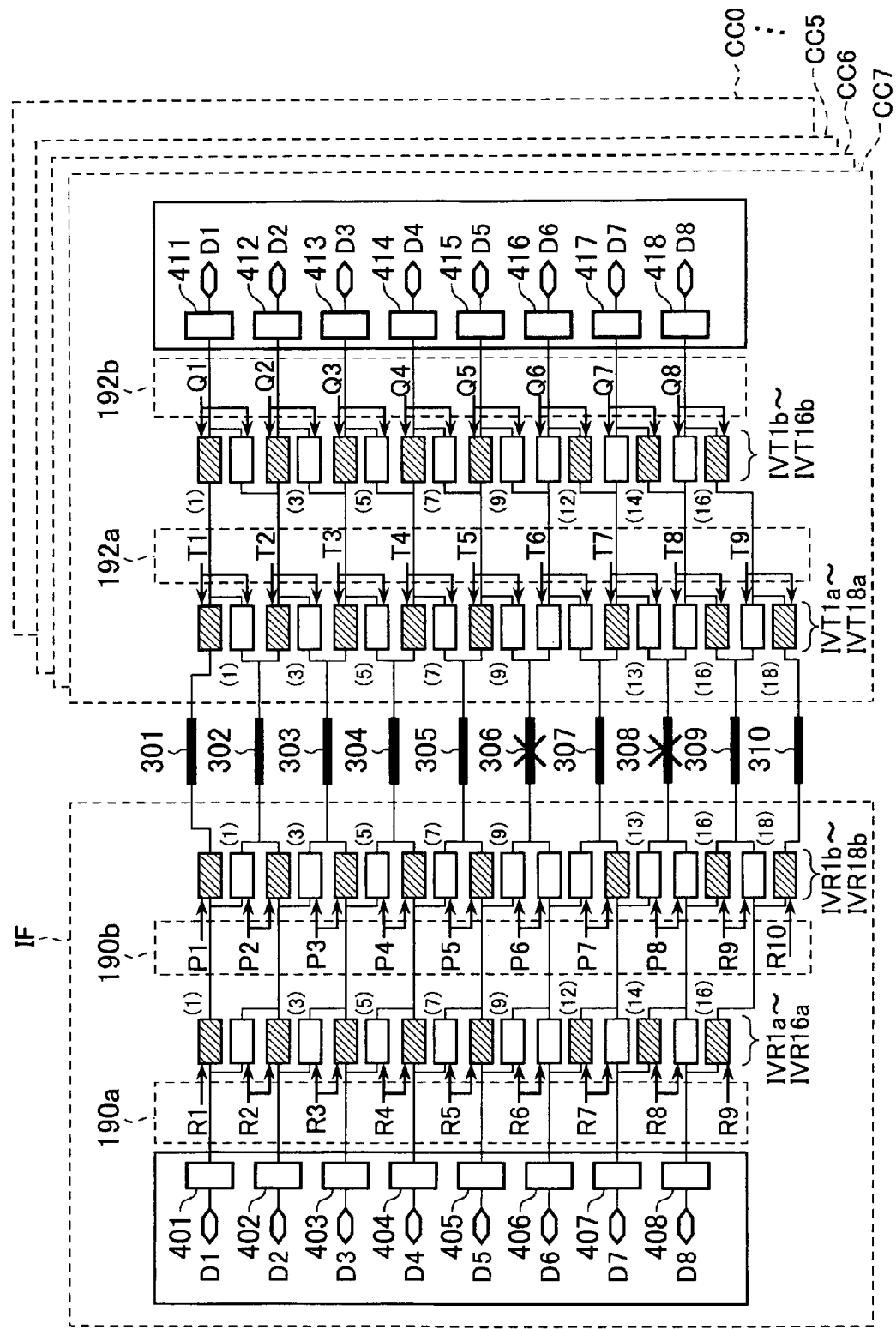
FIG. 8 is a schematic diagram showing another example of an overall connection relation between the interface chip and the core chips.

FIG. 8 is a schematic diagram showing another example of an overall connection relation between the interface chip IF and the core chips CC0 to CC7. FIG. 8 shows a state where the through silicon vias 306 and 308 are defective. In FIG. 8, among the tri-state inverters, the tri-state inverters those are activated are hatched by oblique lines.

As shown in FIG. 8, two auxiliary through silicon vias 309 and 310 are allocated with respect to eight through silicon vias 301 to 308. Thus, the total number of the through silicon vias is ten. Two output switching circuits 190a and 190b are arranged on the interface chip IF side and two input switching circuits 192a and 192b are arranged on the core chips CC0 to CC7 side. The interface chip IF includes two stages of tri-state inverters IVR1a to IVR16a and IVR1b to IVR18b. The output switching circuit 190a controls the tri-state inverters IVR1a to IVR16a. The output switching circuit 190b controls the tri-state inverters IVR1b to IVR18b.

Similarly, the input switching circuits 192a and 192b respectively include tri-state inverters IVT1a to IVT18a and IVT1b to IVT16b forming a two-step structure. In the input switching circuit 192a, input selection signals T1 to T9 control the tri-state inverters IVT1a to IVT18a, and in the input switching circuit 192b, input selection signals Q1 to Q8 control the tri-state inverters IVT1b to IVT16b.

By providing the two output switching circuits 190a and 190b and the two input switching circuits 192a and 192b that include the tri-state inverters in two stages, the connection relation between the through silicon vias 301 to 310 and the driver circuits 401 to 408, and the connection relation between the through silicon vias 301 to 310 and the receiver circuits 411 to 418 can be shifted by maximum two units.

When one through silicon via $30x$ (x is a value from 1 to 8) is defective, the i-th through silicon via is selected for the driver circuit whose last digit of the reference numeral is 1 to x−1 and the (i+1)-th through silicon via is selected for the driver circuit whose last digit of the reference numeral is x to 8. When two through silicon vias $30x$ and $30y$ ($x<y$) are defective, the i-th through silicon via is selected for the driver circuit whose last digit of the reference numeral is 1 to x−1, the (i+1)-th through silicon via is selected for a driver circuit whose last digit of the reference numeral is x to y−2, and an (i+2)-th through silicon via is selected for a driver circuit whose last digit of the reference numeral is y−1 to 8.

As a specific example, when the through silicon vias 306 and 308 are defective (x=6 and y=8), the driver circuits 401 to 405 are respectively connected to the receiver circuits 411 to 415 via the through silicon vias 301 to 305. The driver circuit 406 is connected to the through silicon via 307 via the tri-state inverters IVR12a and IVR13b. Furthermore, the through silicon via 307 is connected to the receiver circuit 416 via the tri-state inverters IVT13a and IVT12b. That is, connection is shifted by one through silicon via.

The driver circuit 407 is connected to the through silicon via 309 via the tri-state inverters IVR14a and IVR16b. The through silicon via 309 is connected to the receiver circuit 417 via the tri-state inverters IVT16a and IVT14b. That is, connection is shifted by two through silicon vias. The driver circuit 408 is connected to the receiver circuit 418 via the through silicon via 310.

With the above configuration, when one of the eight through silicon vias 301 to 308 is defective, it is relieved by shifting the connection relation by one through silicon via with the defective through silicon via as a boundary. Furthermore, when two through silicon vias among the nine through silicon vias 301 to 309 are defective, it is relieved by, between the two defective through silicon vias, first, shifting the connection relation by one through silicon via with a defective through silicon via having a relatively smaller reference numeral as a boundary, and then, further shifting the connection relation by one through silicon via with a defective through silicon via having a relatively larger reference numeral as a boundary.

Figure 9:
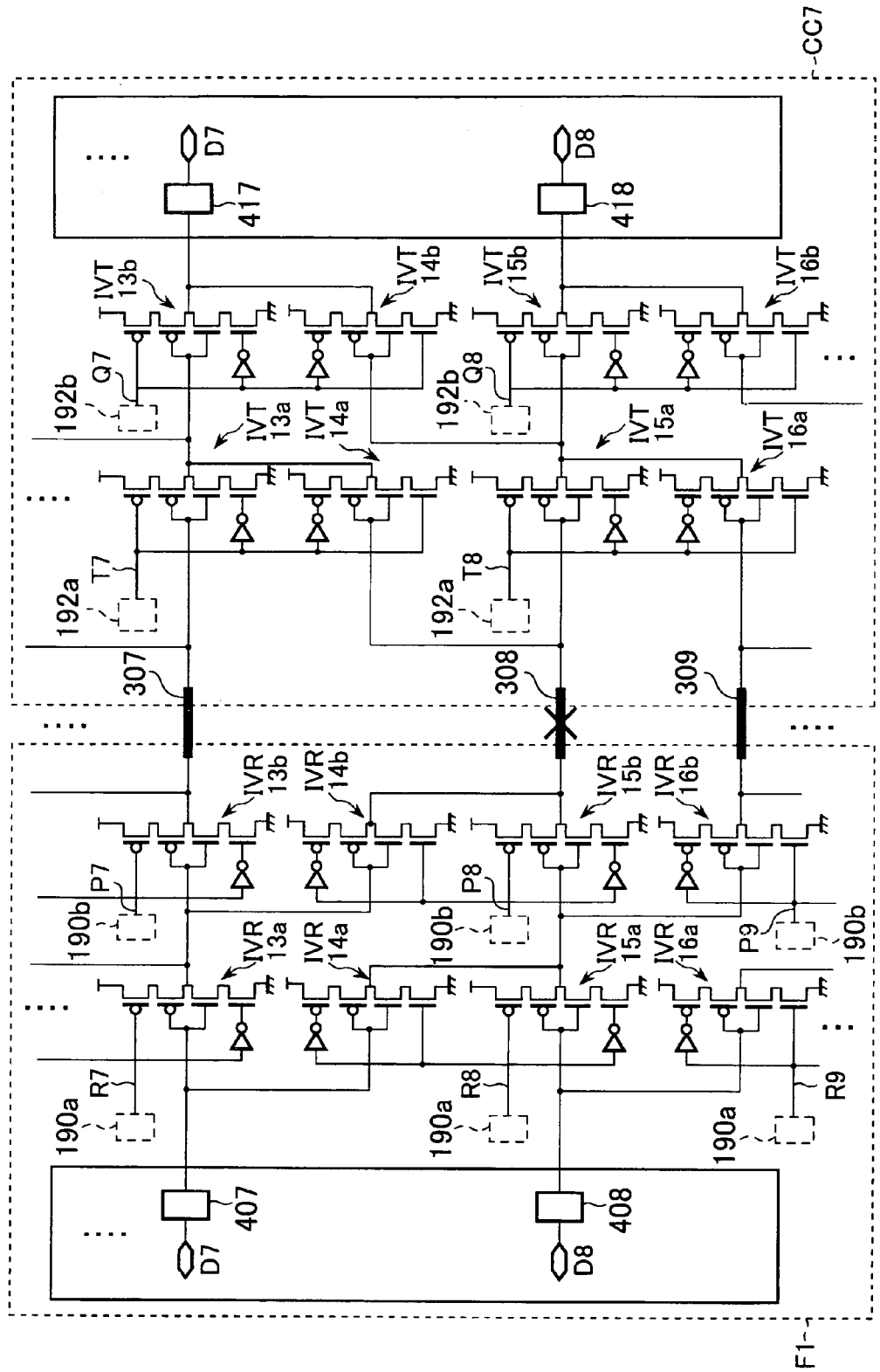
FIG. 9 is a circuit diagram showing the connection relation shown in FIG. 8 in more detail.

FIG. 9 is a circuit diagram showing the connection relation shown in FIG. 8 in more detail. When the through silicon vias 306 and 308 are defective, the driver circuit 406 is connected to the receiver circuit 416 via the through silicon via 307 instead of the through silicon via 306. Furthermore, the driver circuit 407 is connected to the receiver circuit 417 via the through silicon via 309, that is, shifting the connection by two through silicon vias. In the configuration shown in FIG. 9, the tri-state inverters IVR14a, IVR16b, IVT16a, and IVT14b are activated. The driver circuit 408 is connected to the receiver circuit 418 via the through silicon via 310.

Figure 10:
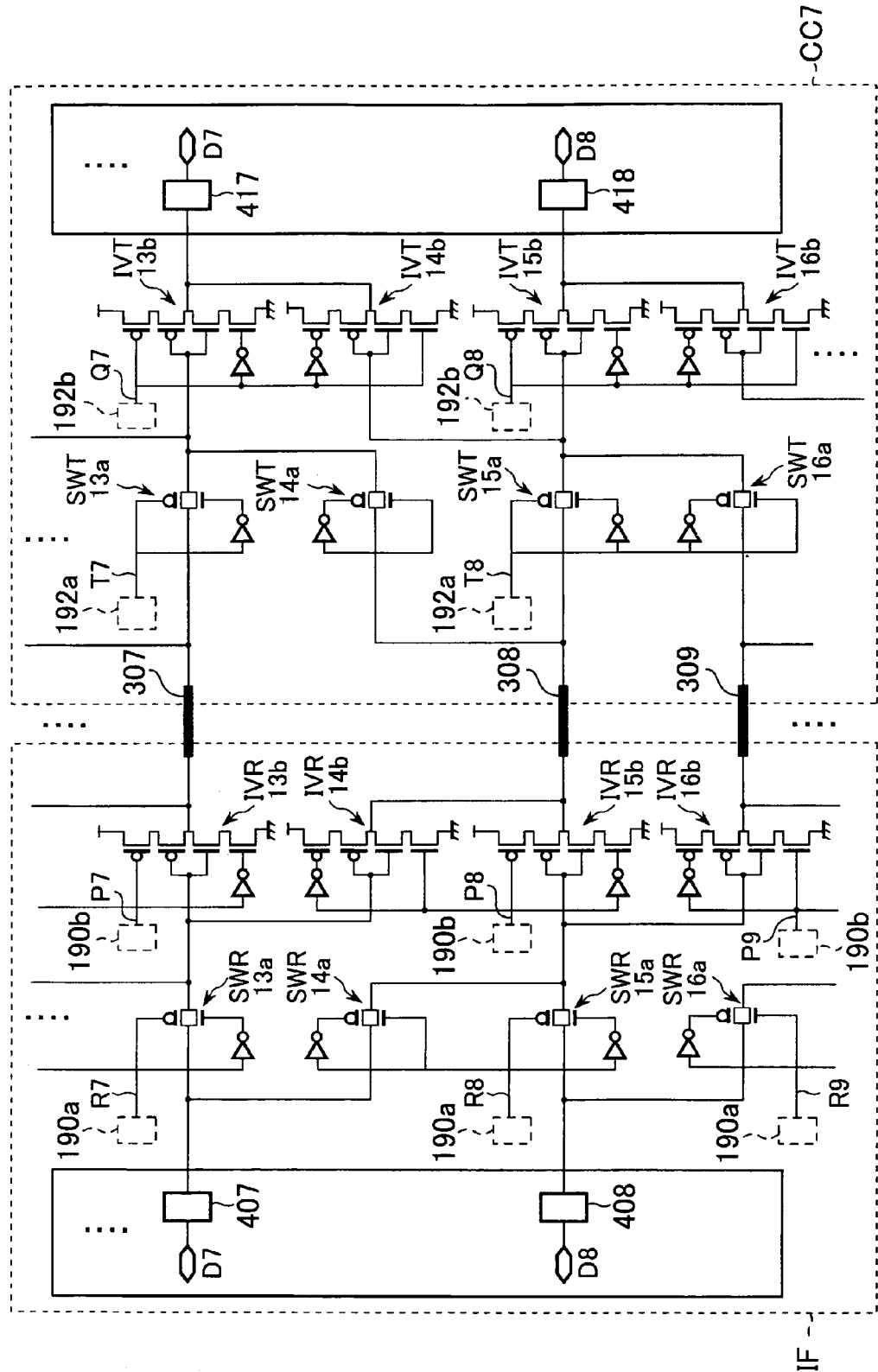
FIG. 10 is a modification example of the circuit diagram shown in FIG. 9.

FIG. 10 is a modification example of the circuit diagram shown in FIG. 9. Unlike FIG. 9, switches SWR1a to SWR16a are used in FIG. 10 instead of the tri-state inverters IVR1a to IVR16a. Similarly, switches SWT1b to SWT16b are used instead of tri-state inverters IVT1b to IVT16b. The switches SWR1a to SWR16a and SWT1b to SWT16b are transfer gates that mutually connect a source and a drain of a PMOSFET and a source and a drain of an NMOSFET, and perform conduction between the source and the drain when the PMOSFET and the NMOSFET are turned on.

When two auxiliary through silicon vias are provided in the circuit configuration shown in FIG. 9 as a prerequisite, four tri-state inverters need to be inserted on a path that connects a driver circuit to a receiver circuit. When only one auxiliary through silicon via is provided, then two tri-state Inverters are required. Because the tri-state inverter functions as the delay element, there is a trade-off relation between the number of auxiliary through silicon vias and a transmission speed of a signal.

As shown in FIG. 10, when the two tri-state inverters among the four tri-state inverters are replaced by switches, the two tri-state inverters and the two switches function as delay elements. When a signal delay amount of the switches is less than that of the tri-state inverters, the signal transmission is easily suppressed in the circuit configuration shown in FIG. 10 when compared with the circuit configuration shown in FIG. 9. As described above, the tri-state inverter functions as both a switch and a signal amplifier. As shown in FIG. 10, the tri-state inverters are provided on an inlet or outlet of a through silicon via where signals are easily attenuated. Therefore, a good signal quality can be easily maintained.

A circuit configuration of the semiconductor memory device 10 according to a preferred embodiment is explained below.

Figure 11:
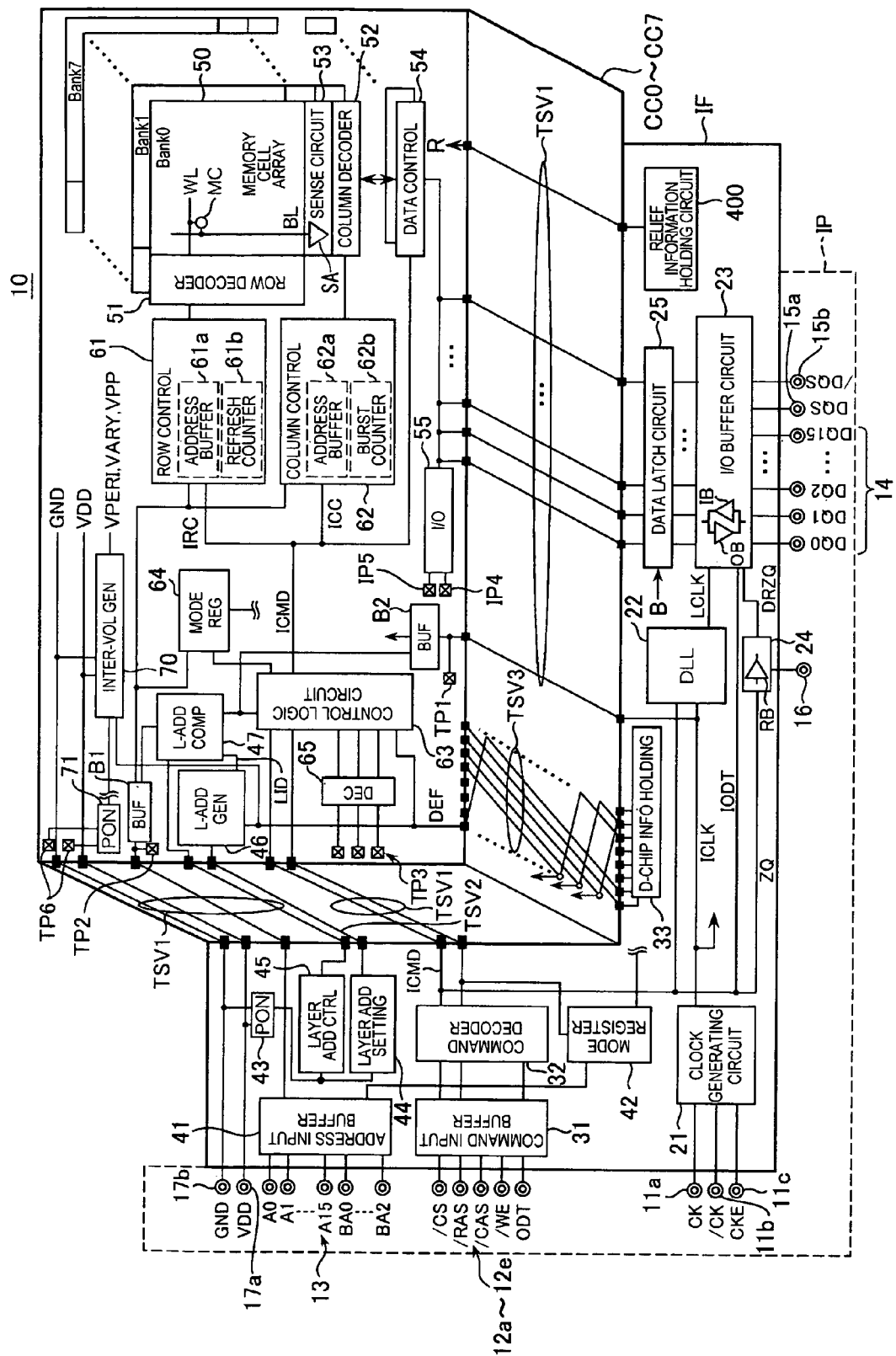
FIG. 11 is a block diagram illustrating the circuit configuration of the semiconductor memory device.

FIG. 11 is a block diagram illustrating the circuit configuration of the semiconductor memory device 10.

As shown in FIG. 11, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the TSVs.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the TSVs.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the TSVs. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different TSVs, and partial parallel/serial conversion may be performed in the core chips CC0 to CC7 and the number of TSVs that are needed for each DQ may be reduced. For example, all of data of 64 bits for each DQ do not need to be input/output using the different TSVs, and 2-bit parallel/serial conversion may be performed in the core chips CC0 to CC7 and the number of TSVs that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17*a* and 17*b* are terminals to which power supply potentials VDD and VSS are supplied, respectively. The power supply terminals 17*a* and 17*b* are connected to a power-on detecting circuit 43 provided in the interface chip IF and are also connected to the core chips CC0 to CC7 through the TSVs. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the TSVs.

The interface chip IF is also provided with a layer address setting circuit 44. The layer address setting circuit 44 is connected to the core chips CC0 to CC7 through the TSVs. The layer address setting circuit 44 is cascade-connected to the layer address generating circuit 46 of the core chips CC0 to CC7 using the TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the TSVs. The defective chip information holding circuit 33 is connected to the core chips CC0 to CC7 while being shifted, using the TSV3 of the type shown in FIG. 2C.

The interface chip IF includes a relief information holding circuit 400. The relief information holding circuit 400 holds the setting of the output selecting signal and the input selecting signal with anti-fuse elements and the like. When a TSV is proved to be defective by the operation test performed after assembly process, a tester writes its setting signal in the relief information holding circuit 400. The setting signal set in the relief information holding circuit 400 is read out at power-on and the output selecting signal and the input selecting signal for the output switching circuit 190 and the input switching circuit 190 are set.

The above description is the outline of the connection relationship between the external terminals and the interface chip IF and the circuit configuration of the interface chip IF. Next, the circuit configuration of the core chips CC0 to CC7 will be described.

As shown in FIG. 11, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor memory device 10 are shared. In the memory cell array 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the TSV, and the row address that is buffered by the address buffer 61a is supplied to the row decoder 51. The address signal that is supplied through the TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the TSV.

The control logic circuit 63 receives an internal command ICMD supplied from the interface chip IF through the TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the TSV and a layer address LID (chip identification information) set to the layer address generating circuit 46. When these are matched, matching signal HIT is activated.

In the layer address generating circuit 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the TSVs of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the TSV. As the defective chip signal DEF is supplied to the individual core chips CC0 to CC7 using the TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the TSV. The internal clock signal ICLK supplied through the TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 Gb are laminated, the semiconductor memory device 10 has a memory capacity of 8 Gb in total. Because the chip selection signal /CS is input to one terminal (chip selection terminal), the semiconductor memory device is recognized as a single DRAM having the memory capacity of 8 Gb, in view of the controller.

In the semiconductor memory device 10 having the configuration described above, a setting signal held in the relief information holding circuit 400 is read out when the power is turned on, and the read setting signal is transmitted to the output switching circuit 190 and the input switching circuit 192 in the interface chip IF and the core chips CC0 to CC7. Further, as explained above, in the interface chip IF and the core chips CC0 to CC7, the defective through silicon via is not simply replaced by the auxiliary through silicon via; however, the defective through silicon via is bypassed by shifting the connection relation. Therefore, a difference in the wiring lengths almost does not occur, between signal paths before and after replacement of the through silicon vias. Thus, because almost no skew is generated, the signal quality can be enhanced.

The tri-state inverters are respectively provided on the inlet and outlet of the through silicon via. Signal attenuation in the through silicon via is compensated by the amplification function of the tri-state inverters, and therefore the signal quality can be enhanced. The tri-state inverter also functions as the switch. As a result, it is not necessary to arrange the circuit delay element in a path that connects the driver circuit to the tri-state inverter or in a path that connects the tri-state inverters to the receiver circuit, and thus transmission delay of signals via the through silicon via can be easily suppressed.

While the present invention has been described by several embodiments, it should be understood by persons skilled in the art that these embodiments are only exemplary, various modifications and changes can be made without departing from the scope of the claims of the present invention, and these modifications and changes are also within the scope of the claims. Therefore, descriptions in this specification and the drawings are intended to be illustrative and not restrictive.

For example, in the above embodiments, a case of supplying data from the interface chip IF to the core chips CC0 to CC7 has been explained as an example; however, in reverse, the same holds true when supplying data from the core chips CC0 to CC7 to the interface chip IF. That is, it is permissible to provide the driver circuit on the core chips CC0 to CC7 side and to provide the receiver circuit on the interface chip IF side. Because the write data supplied from the interface chip IF to the core chips CC0 to CC7 and the read data supplied from the core chips CC0 to CC7 to the interface chip IF are transmitted via the same through silicon vias, for such through silicon vias, both the driver circuit and the receiver circuit are provided in each of the interface chip IF and the core chips CC0 to CC7.

For example, in the above embodiments, a chip-stacked DRAM has been explained as an example. However, in the present invention, the type of semiconductor chips to be stacked is not particularly limited thereto. It can be other memory devices such as an SRAM, a PRAM, an MRAM, an RRAM, and a flash memory, or can be a logical system device such as a CPU and a DSP.

What is claimed is:

1. A semiconductor device comprising:
   M (being an integer of two or more) pieces of drivers;
   N (being an integer of three or more) pieces of through silicon vias that include M pieces of normal silicon vias and a first auxiliary through silicon via, the M pieces of normal silicon vias including first and second normal through silicon vias; and
   a signal path formation circuit coupled between the M pieces of drivers and the N pieces of through silicon vias to form M pieces of signal paths, each of the M pieces of signal paths being formed between an associated one of the M pieces of drivers and an associated one of M pieces of through silicon vias, the M pieces of through silicon vias excluding in a first state the first auxiliary silicon via and including in a second state the first auxiliary through silicon via that replaces one of the M pieces of normal through silicon vias,
   the signal path formation circuit comprising a plurality of tri-state inverters each driving, when activated, an output node thereof in response to a signal supplied to an input node thereof and disconnecting, when deactivated, the output node from the input node,
   the tri-state inverters including:
      a first tri-state inverter connected at the output node exclusively to the first normal through silicon vias;
      second and third tri-state inverters connected at the output nodes thereof in common to the second normal through silicon via; and
      a fourth tri-state inverter connected at the output node exclusively to the first auxiliary through silicon via,
   each of the M pieces of signal paths including therein an associated one of activated tri-state inverters of the first to fourth inverters in either of the first and second states.

2. The device as claimed in claim 1, wherein each of the tri-state inverters comprises first and second transistors connected in series between a first power line and the output node and third and fourth transistor connected in series between the output node and a second power line, the first and third transistors being connected at control electrodes thereof to the input node, each of the second and fourth transistors being rendered conductive when activated and nonconductive when deactivated, each of the first and second transistors being of a first conductivity type and each of the third and fourth transistors being of a second conductivity type.

3. The device as claimed in claim 1, comprising first and second semiconductor chips stacked with each other through the N pieces of through silicon vias.

4. The device as claimed in claim 3, wherein the first semiconductor chip includes the M pieces of drivers, the N pieces of through silicon vias and the signal path formation circuit.

5. The device as claimed in claim 3, wherein the first semiconductor chip includes the M pieces of drivers and the signal path formation circuit and the second semiconductor chip includes the N pieces of through silicon vias.

6. The device as claimed in claim 1, comprising a first semiconductor chip and a plurality of second semiconductor chips, the first and second semiconductor chips being stacked with one another through the N pieces of through silicon vias, the first semiconductor chip including the M pieces of drivers and the signal path formation circuit.

7. The device as claimed in claim 1,
wherein the drivers includes first and second drivers,
wherein the N pieces of through silicon vias further include a second auxiliary through silicon via,
wherein the tri-state inverters further includes:
fifth and sixth tri-state inverters connected at the output nodes in common to the second auxiliary through silicon via;
seventh and eight tri-state inverters connected at the input nodes in common to the first driver; and
ninth and tenth tri-state inverters connected at the input nodes in common to the second driver;
wherein the M pieces of through silicon vias excludes in the first state both of the first and second auxiliary silicon vias, includes in the second state both of the first and second auxiliary through silicon vias that replace two of the M pieces of normal through silicon via, respectively, and includes in a third state the second auxiliary through silicon via that replaces one of the M pieces of normal through silicon vias while excluding the first auxiliary through silicon via, and
wherein each of the M pieces of signal paths includes therein an associated two of activated tri-state inverters of the first to tenth inverters in series in either of the first, second and third states.

8. The device as claimed in claim 7, wherein each of the tri-state inverters comprises first and second transistors connected in series between a first power line and the output node and third and fourth transistor connected in series between the output node and a second power line, the first and third transistors being connected at control electrodes thereof to the input node, each of the second and fourth transistors being rendered conductive when activated and nonconductive when deactivated, each of the first and second transistors being of a first conductivity type and each of the third and fourth transistors being of a second conductivity type.

9. The device as claimed in claim 7, comprising first and second semiconductor chips stacked with each other through the N pieces of through silicon vias.

10. The device as claimed in claim 9, wherein the first semiconductor chip includes the M pieces of drivers, the N pieces of through silicon vias and the signal path formation circuit.

11. The device as claimed in claim 9, wherein the first semiconductor chip includes the M pieces of drivers and the signal path formation circuit and the second semiconductor chip includes the N pieces of through silicon vias.

12. The device as claimed in claim 9, wherein the second semiconductor chip serves as a memory chip and the first semiconductor chip serves as an interface chip to perform a data read/write operation on the second semiconductor chip.

13. The device as claimed in claim 3, wherein the second semiconductor chip serves as a memory chip and the first semiconductor chip serves as an interface chip to perform a data read/write operation on the second semiconductor chip.

14. The device as claimed in claim 7, comprising a first semiconductor chip and a plurality of second semiconductor chips, the first and second semiconductor chips being stacked with one another through the N pieces of through silicon vias, the first semiconductor chip including the M pieces of drivers and the signal path formation circuit.

15. The device as claimed in claim 14, wherein each of the second semiconductor chips serves as a memory chip and the first semiconductor chip serves as an interface chip to perform a data read/write operation on each of the second semiconductor chips.

* * * * *